United States Patent
Pankove

(12) 
(10) Patent No.: US 6,527,857 B1
(45) Date of Patent: Mar. 4, 2003

(54) METHOD AND APPARATUS FOR GROWING A GALLIUM NITRIDE BOULE

(75) Inventor: Jacques Isaac Pankove, Boulder, CO (US)

(73) Assignee: Astralux, Inc., Boulder, CO (US)

(*) Notice: Subject to any disclaimer, the term of this patent is extended or adjusted under 35 U.S.C. 154(b) by 78 days.

(21) Appl. No.: 09/687,152

(22) Filed: Oct. 12, 2000

Related U.S. Application Data

(60) Provisional application No. 60/159,163, filed on Oct. 13, 1999.

(51) Int. Cl.$^7$ ................................................. C30B 25/12
(52) U.S. Cl. ........................ 117/98; 117/107; 117/952; 118/927; 118/729
(58) Field of Search ..................... 117/98, 107, 952; 118/727, 729

(56) References Cited

U.S. PATENT DOCUMENTS

| | | | | |
|---|---|---|---|---|
| 3,441,453 A | * | 4/1969 | Conrad | 118/727 |
| 3,869,322 A | * | 3/1975 | Cuomo et al. | 148/188 |
| 4,081,313 A | * | 3/1978 | McNeilly et al. | 117/952 |
| 4,507,169 A | * | 3/1985 | Nogami | 117/98 |
| 5,587,014 A | * | 12/1996 | Iyechika et al. | 117/90 |

FOREIGN PATENT DOCUMENTS

| JP | 53-104598 | * | 9/1978 | |
|---|---|---|---|---|
| JP | 2-211260 | * | 8/1990 | 117/952 |

OTHER PUBLICATIONS

Article Entitled "Lateral Epitaxy of Low Defect Density GaN Layers Via Organometallic Vapor Phase Epitaxy" By O. Nam et al., Applied Physics Letters 71, 11/97, pp. 2638–2640.

Article Entitled "Near Defect Free GaN Substrates" By S. Porowski, MRS Soc. Symp. Proc., vol. 537, G1.3, 1999.

* cited by examiner

*Primary Examiner*—Robert Kunemund
(74) *Attorney, Agent, or Firm*—Holland & Hart LLP; Francis A. Sirr, Esq.

(57) ABSTRACT

A GaN boule is epitaxially grown by reacting a vapor of the metal Ga with the gas $NH_3$ at a high temperature of about 1200-degrees C., which high temperature causes the $NH_3$ to dissociate into the two elements N and H. A seed 51 of GaN is placed within a growth-furnace that is heated to about 1200-degrees C., and an input stream of Ga vapor and $NH_3$ gas are directed incident on the GaN seed. An upward-facing, shower head-shaped, manifold is provided to uniformly distribute the Ga vapor and the $NH_3$ gas to the interior of the growth-furnace at a location that is generally below and spaced from the bottom of the GaN seed. GaN vapor is thus formed within this space, generally adjacent to the surface of the boule. At the exterior surface of the GaN seed, the Ga vapor reacts with the $NH_3$ gas to epitaxially form solid GaN on the exterior surface of the GaN seed, and to also form $H_2$.

16 Claims, 2 Drawing Sheets

METHOD AND APPARATUS FOR GROWING A GALLIUM NITRIDE BOULE

CROSS REFERENCE TO RELATED APPLICATION

This patent application claims the benefit of prior filed copending provisional patent application serial No. 60/159,163 filed on Oct. 13, 1999 and entitled Growth of Gallium Nitride Boule.

BACKGROUND OF THE INVENTION

1. Field of the Invention

This invention relates to the field of semiconductor manufacture, and more specifically to the making of gallium nitride (GaN) from the reaction of gallium (Ga) vapor with gaseous anhydrous ammonia ($NH_3$).

2. Description of the Related Art

Gallium nitride is a well-known refractory nitride optoelectronic material from the group of III nitrides having an energy gap that covers the spectral range from red to deep ultraviolet. Among its known uses are color displays, color copying, optical storage, power and microwave electronics, optoelectronics, and radiation detection from infrared to X-rays.

One of the first instances of GaN synthesis was by Juza and Hahn when ammonia was passed over hot gallium to produce small needles and platelets of GaN. Later, Maruska and Tietjen used chemical vapor deposition to make a large area of crystalline GaN on sapphire.

For commercial GaN device applications, metalorganic chemical vapor deposition (MOCVD) has been used to produce super bright blue light-emitting diodes (LEDs).

Without limitation thereto, prior methods of making GaN include the above-defined MOCVD process, a reactive sputtering process wherein atoms or ions of a solid material target are ejected into a gas phase by a momentum exchange with energetic particles, the growth of GaN by the vapor phase epitaxy (VPE) method, and the growth of GaN by the molecular beam epitaxy (MBE) method.

VPE is a chemical vapor deposition method that is carried out in a hot wall reactor at up to atmospheric pressure wherein gallium monochloride (GaCl) is synthesized upstream in the reactor by reacting HCl gas with liquid Ga metal at from 800 to 900-degrees C. GaCl is then transported to a substrate where the GaCl reacts with $NH_3$ at 900 to 1100-degrees C. to form GaN via the following reaction.

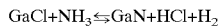

$$GaCl + NH_3 \leftrightarrows GaN + HCl + H_2$$

The primary precursor gases that are employed during growth of GaN by the MOCVD process are $Ga(CH_3)_3$ or $Ga(C_2H_5)_3$ and $NH_3$, while $GaCl_3$ and $NH_3$ are also used for the growth of GaN by the halide VPE method.

MBE is a thin-film deposition process in which beams of atoms or molecules react on a clean surface of a single-crystalline substrate that is held at a high temperature under an ultrahigh vacuum of better than $10^{-10}$ torr. GaN has been grown by MBE using $NH_3$ as the source of molecular nitrogen ($N_2$) wherein the $NH_3$ is decomposed on the surface of a substrate by pyrolysis at from 700 to 900-degrees C., and wherein N reacts with Ga to form GaN. The growth mechanism of GaN by MBE is believed to consist of the thermal activation of $NH_3$ and surface reaction mitigated dissociation followed by reaction of N with Ga to form GaN.

Reference can be made to the two publications entitled "Gallium Nitride (GaN) 1" and "Gallium Nitride (GaN) II", by Jacques I. Pankove and Theodore D. Moustakas, volumes 50 and 57 of "Semiconductors and Semimetals", Academic Press, copyright 1998 and 1999, for a discussion of GaN.

It is against the above generally stated background that the present invention was made.

SUMMARY OF THE INVENTION

A high quality GaN boule 60 (i.e., a carrot-shaped and generally synthetically formed mass of GaN having the structure of a single crystal) is epitaxially grown by reacting a vapor of the metal Ga with the gas $NH_3$ at a high temperature of about 1200-degrees C., which high temperature causes the $NH_3$ to dissociate into the two elements N and H.

While $NH_3$ is know, as a result of measurements made by the present inventor, to require a temperature of about 1400 degrees C. in order to produce a dissociation of the $NH_3$, in accordance with the present invention the presence of Ga vapor acts as a catalyst that lowers the dissociation temperature of $NH_3$ to about 750-degrees C.

In accordance with this invention, a seed 51 of GaN is placed within a growth furnace 30 that is heated to about 1200-degrees C. An input stream of Ga vapor and an input stream of $NH_3$ gas are then incident on the GaN seed. Again as a result of measurements made by the present inventor, it was determined that GaN does not decomposed at 1200-degrees C. in the presence of $NH_3$.

Ga is a solid at room temperature, Ga becomes a liquid at about 30-degrees C., and Ga becomes a vapor at the temperature that is within the growth-furnace.

An upward-facing, shower head-shaped, manifold 10 of unique construction is provided to uniformly distribute the Ga vapor and the $NH_3$ gas to the interior of the growth furnace at a location that is generally below and spaced from the bottom of the GaN seed, for example, spaced by a distance of from about 0.5 to about 10 mm. GaN vapor is thus formed within this space, generally adjacent to the surface of the boule.

Ga vapor is flushed or carried into the growth furnace by way a controlled stream of nitrogen ($N_2$). At the location of the exterior surface of the GaN seed, the Ga vapor reacts with the $NH_3$ gas to epitaxially form solid GaN on the exterior surface of the GaN seed, and to also form $H_2$.

While it is possible that some GaN vapor forms within the growth furnace, and then deposits epitaxially on the GaN seed, it is believed that most of the solid GaN epitaxially forms on the GaN seed from a combination of the Ga vapor with the N that results from the decomposition of the $NH_3$. In other words, most of the Ga vapor moves away from the manifold and toward the surface of the GaN seed, whereupon the Ga vapor combines with N and then deposits on, and thereby epitaxially grows, the boule.

The manifold flat top surface 11 includes a plurality of physically-spaced nozzles 13, each nozzle having a generally circular-shaped orifice. A heated chamber 21 is formed directly under this top surface, and this heated chamber includes the nozzles. Liquid Ga is compressed, using a motorized pipette 39, and the compressed Ga vapor is then piped, under pressure, into the nozzles, along with nitrogen. Within the hot nozzles the Ga vaporizes, as the Ga vapor is mixed with a controlled amount of nitrogen gas.

Gaseous $NH_3$ is also supplied under pressure to portions of the hot chamber that surround the Ga nozzles, so as to flow through areas 131 of the manifold top flat surface that surround each Ga nozzle. As a result of the relatively high temperature of about 1200-degrees C. that exists at and above the manifold's top surface, GaN vapor moves upward toward the exterior surface of the GaN seed.

DESCRIPTION OF THE PREFERRED EMBODIMENTS

Figure 1:
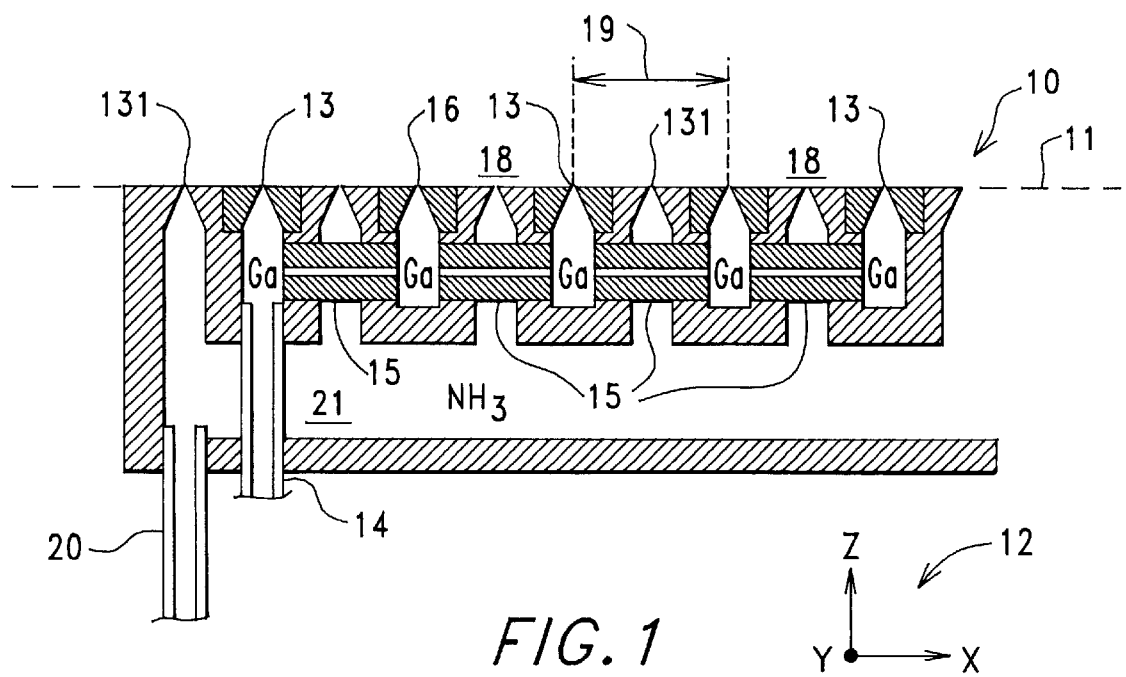
FIG. 1 is a partial side section view of a shower-head manifold 10 in accordance with the invention, this figure showing five nozzles 13 through which Ga vapor flows, this figure showing a first supply pipe 14 that supplies Ga liquid and $N_2$ gas to the five flow interconnected Ga nozzles, and this figure showing a second supply pipe 20 that supplies gaseous $NH_3$ through $NH_3$ nozzle portions 131 of the manifold that surround the Ga nozzles.

FIG. 1 is a partial side section view of a hot or heated shower head manifold 10 in accordance with the invention. Without limitation to a specific geometric orientation,.in an embodiment of the invention hot manifold 10 included a generally flat and horizontal planar upper face that is indicated by numeral 11. That is, nozzle face 11 lies in an X-Y plane of coordinate system 12, wherein the Z axis of coordinate system 12 indicates the upwardly-directed vertical axis.

Five nozzles 13 are shown in FIG. 1 through which Ga vapor and $N_2$ gas flows in an upward or Z-direction. A first supply pipe 14 supplies Ga vapor and $N_2$ gas to nozzles 13, which nozzles 13 are flow interconnected by way of conduits 15. , As will be appreciated, Ga liquid turns to vapor by the time it reaches manifold 10. Without limitation thereto, in an embodiment of the invention each nozzle 13 included a generally centrally located and circular-shaped orifice 16 having a diameter of about 0.5 mm. Also without limitation, an example center-to-center distance 19 between adjacent nozzles 13 was about 5 mm.

FIG. 1 also shows a second supply pipe 20 that supplies pressurized anhydrous $NH_3$ gas to the internal portion 21 of hot manifold 10 that surround Ga nozzles 13. This $NH_3$ gas flows through the nozzle or nozzle space 131 that surrounds each Ga nozzle 13.

Figure 2:
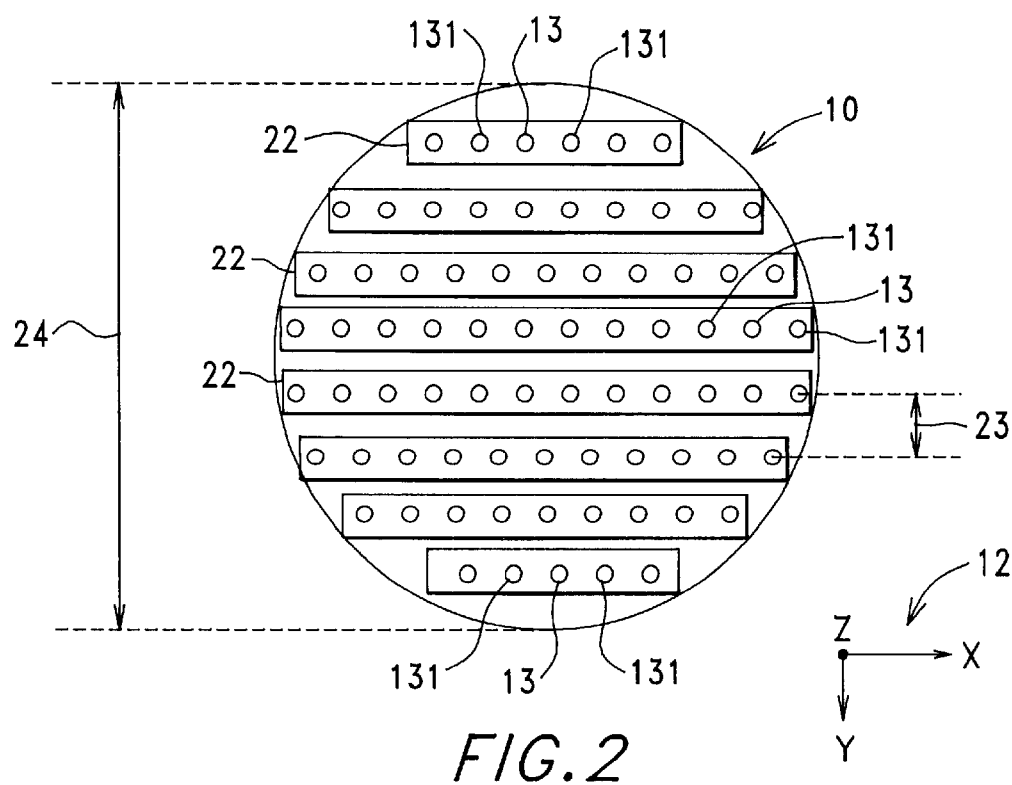
FIG. 2 is a top view of the shower-head manifold of FIG. 1, this figure showing eight generally parallel nozzle members 22, each nozzle member having a linear plurality of individual Ga vapor nozzles that alternate with a plurality of individual $NH_3$ nozzles.

FIG. 2 is a top view of generally circular shower head manifold 10, this figure showing eight generally parallel and linear nozzle members 22, each nozzle member 22 having a plurality of individual Ga nozzles 13, each Ga nozzle having an adjacent $NH_3$ nozzle or nozzle space 131.

Without limitation thereto, members 22 are preferably evenly spaced by a distance 23 of about 5 mm. Also without limitation thereto, the diameter 34 of circular manifold 10 is in the range of from about 1 to about 2.5 cm.

Manifold 10 is preferably constructed of a metal that will withstand the processing temperatures of the present invention, and of a metal that is compatible with the materials being processed by the present invention, examples being stainless steel and molybdenum.

By operation of manifold 10, and as a result of a temperature of about 1200-degrees C., a generally uniform gaseous distribution that includes Ga vapor, $NH_3$ gas, $N_2$ gas, and $H_2$ gas is produced in the area 18 that is directly above the top surface 11 of manifold 10. Generally at this location 18, GaN vapor is produced, the GaN vapor then moving or migrating upward in the Z-direction.

It is believed that at 1200-degrees C. any decomposition of GaN into Ga and N is in equilibrium with the formation of GaN. Also, Ga vapor reaching the GaN seed reacts rapidly with $NH_3$ to form an epitaxial layer of GaN on the surface of the seed.

Figure 3:
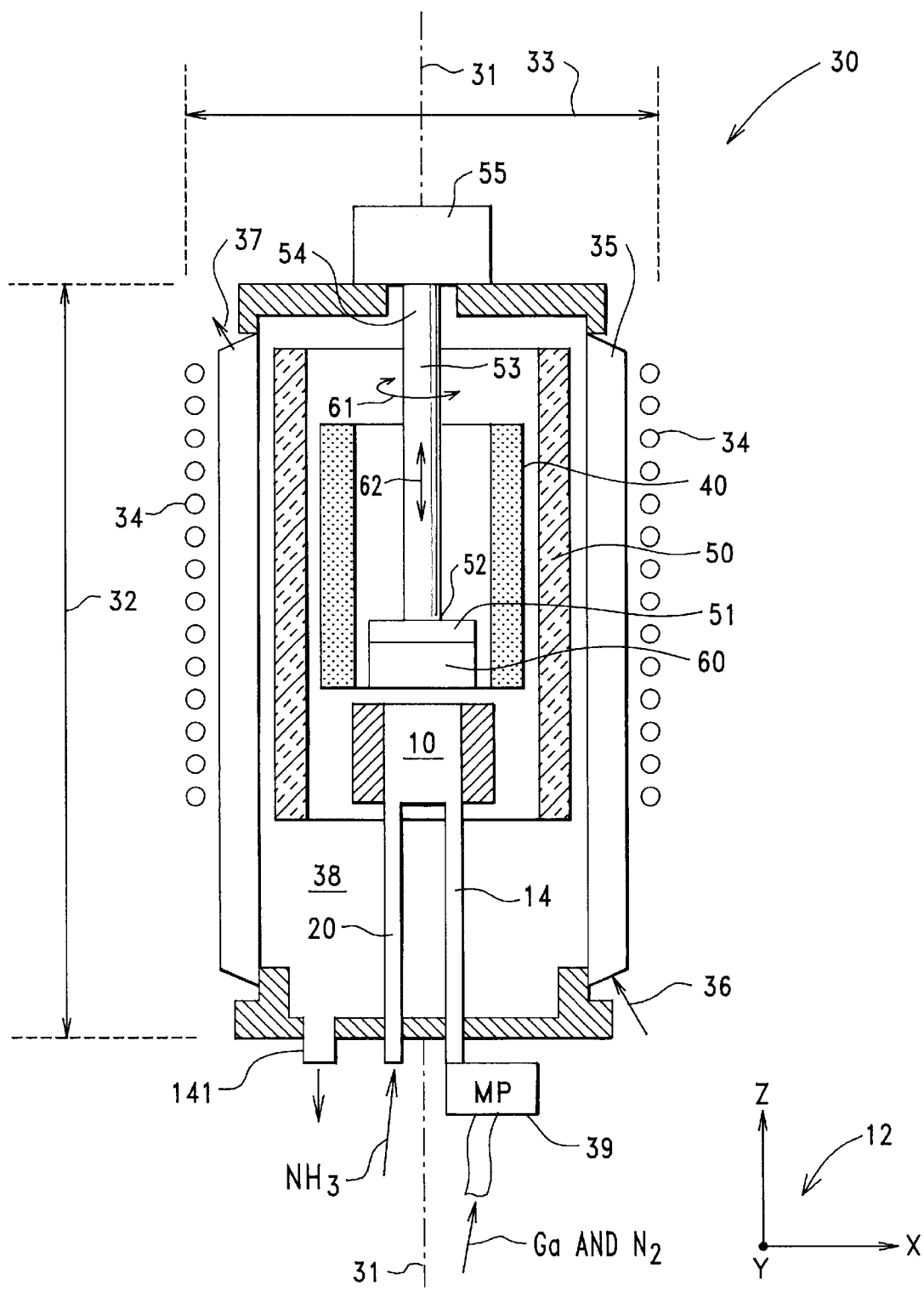
FIG. 3 is a side section view of a growth-furnace 30 in accordance with the invention, this growth furnace having the manifold of FIGS. 1 and 2 located within the bottom half of the furnace.

FIG. 3 is a side section view of a growth-furnace 30 in accordance with the invention wherein manifold 10 of FIGS. 1 and 2 is located within the bottom half of furnace 30. Without limitation, furnace 30 is in the form of a hollow cylinder having a closed top and bottom, and whose central axis 31 extends vertically in the Z-direction, the Z-direction height 32 of furnace 30 being at least 10 cm, and the diameter 33 of furnace 30 being about 10 cm for growing a boule having a 1 cm diameter. Of course, for the growing of larger size boules, the size of furnace 30 is increased.

Furnace 30 is heated in a well-known manner by a water-cooled radio frequency (RF) induction heater 34 that encircles furnace 30. A water cooling jacket 35 is provided, cooling jacket 35 having a water inlet 36 and a water outlet 37. In a manner that is not critical to the invention, RF heater 34 is controlled by means not shown, so as to controllable reach and then maintain a temperature of about 1200-degrees C. within the interior volume 38 of furnace 30. Furnace 30 includes two inlets 14 and 20 and one outlet 141.

As shown, and in an embodiment of the invention, above-described hot manifold 10 is mounted at a fixed position in the lower half of furnace 30, generally centered on central axis 31. Liquid Ga is compressed, using motorized pipette 39, and the Ga liquid is supplied, under pressure, to conduit 14, along with a pressurized flow of $N_2$. Gaseous $NH_3$ is also supplied, under pressure, to the interior volume 21 of hot manifold 10 by way of conduit 20.

A vertically-extending hollow cylinder silicon carbide coated (SiC-coated) graphite susceptor 40 is concentrically located generally in the vertical center of furnace 30. In a well known manner, susceptor 40 is induction heated by operation of RF heater 34. Without limitation thereto, susceptor 40 is preferably surrounded by a relatively long vertical cylinder of porous graphite hollow cylinder thermal insulator 50 that is also centered upon axis 31. Insulator 50 is provided to minimized heat loss from the cylindrical susceptor heating element 40 that is concentrically located inside of thermal insulator 50.

The GaN boule that is grown in accordance with the present invention is indicated in FIG. 3 by numeral 60. Boule 60 is physically grown on a GaN seed 51 that is attached to or fixed to the bottom end 52 of a metal shaft 53, for example a stainless steel shaft 53, that extends generally coincident with axis 31.

The upper end 54 of shaft 53 is attached to or fixed to an electrically operated rotator/puller motor means 55, As boule 60 grows, motor means 55 is operable to bidirectionally move shaft 53 in a vertical direction, as shown by arrow 62, and/or to bidirectionally rotate shaft 53, as shown by arrow 61. Rotary movement 61 is provided to homogenize the growth of GaN over the whole external area of seed 51. Examples of rotary movement 61 and linear movement 62 are from about 1 to about 100 revolutions per minute, and from about 0.3 to about 1.0 mm per hour, respectively.

Under equilibrium conditions, the vertical spacing or vertical separation of the top surface 11 of manifold 10 from the bottom surface of the growing boule remains substantially constant at from about 0.3 to about 1 mm. Motor means 55 provides simultaneous circular movement 61 and vertical movement 62, motor means 55 being controlled by means not shown so as to maintain this vertical spacing substantially constant. For example, optical sensing means or capacitive sensing means, not shown, are provided to monitor this vertical spacing and to control motor means 55 in a manner to maintain the desired constant spacing.

As a feature of the invention, the growth of boule 60 can be momentarily interrupted by inserting a puff of $N_2$ into Ga vapor supply line 14, thus leaving boule 60 and manifold 10 in an $NH_3$ environment that prevents the net decomposition of GaN.

As a feature of the invention, single crystal boules 60 of $Ga_{1-x}Al_xN$ can be grown by adding aluminum (Al) vapor to the Ga vapor. Similarly, by adding indium (In) vapor to the Ga vapor a single crystal boule 60 of $In_{1-x}Ga_xN$ can be grown. The growth of In-rich InGaN preferably requires a graded concentration of In within the boule in order to reduce the strain that results from a lattice mismatch of InN and GaN. Of interest is the use of the invention to grow a boule 60 of $Al_{1-x}Ga_{xy}In_{1-y}N$ that matches the lattice constant of GaN.

It is important that a good seed 51 be provided. Such a seed can be produced by lateral epitaxial overgrowth over $SiO_2$ strips or $SiN_4$ strips, as taught in O. H. Nam et al, Applied Physics Letters, 71, 2638, 1997.

Another technique of producing a seed 51 is to use a ZnO single crystal that has a mismatch of about 2-percent in lattice constant with respect to GaN. In this case, it may be desirable to coat the ZnO with GaN at a low temperature in order to prevent decomposition of the ZnO, followed by the high temperature growth of GaN.

Another seed technique is to make a van-der-Waals seed/substrate having a good lattice match to GaN. Two such seed/substrate candidates are $MoS_2$ and $WS_2$ which have a lattice mismatch of about 0.6-percent to GaN. These seeds are mica-like crystalline layers of SMS that are weakly bonded between adjacent S layers, where M stands for $M_o$ or W.

A preferred seed method starts with a single crystal platelet fabricated by Unipress in accordance with S. Porowski, "Near Defect Free GaN Substrates", MRS Soc. Symp. Proc., Vol. 537, G1.3, 1999. This Unipress platelet is grown from liquid Ga under high pressure of $N_2$. The resulting platelet is about 1 square centimeter in area and contains few defects; i. e., about $10^2$ defects per square centimeter as compared to about $10^8$ defects per square centimeter when MOCVD techniques are used.

Once a boule 60 is grown to a cross-sectional area of about 1 square centimeter, the boule can be sliced, to thereby form low defect wafers. These wafers can then be assembled, using x-ray diffraction guidance, into a well oriented larger size wafer that can then be used as larger seed for the growth of a much larger boule in accordance with this invention.

The invention has been described above while making reference to various embodiments of the invention. However, it is known that other skilled in the art, upon learning of this invention, will readily visualize yet other embodiments that are within the spirit and scope of this invention. Thus, the above detailed description is not to be taken as a limitation on the spirit and scope of this invention.

What is claimed is:

1. A method of epitaxially growing GaN on the external surface of a GaN seed, comprising the steps of:

providing a GaN seed;

positioning said GaN seed within a growth furnace;

heating said growth furnace to a temperature of about 1200-degrees C.;

providing a gas-flow manifold within said growth furnace at a location that is physically spaced from said GaN seed, said manifold having first nozzle means and second nozzle means;

providing a flow of Ga vapor to said first nozzle means;

providing a flow of $NH_3$ gas to said second nozzle means; and providing motive means to rotate said GaN seed and to linearly move said GaN seed away from said manifold as GaN layers are epitaxially grown.

2. The method of claim 1 including the step of:

as GaN layers are epitaxilly grown, continuously maintaining said manifold spaced from said epitaxial grown GaN layers by a distance from about 0.3 to about 1 mm.

3. The method of claim 2 including the step of:

as GaN layers are epitaxially grown, continuously rotating said GaN seed at from about 1 to about 100 revolutions per minute.

4. A method of growing GaN crystals on the external surface of a GaN seed, comprising the steps of:

providing a reactor furnace;

providing a GaN seed;

positioning said seed within said furnace;

providing a gas-flow manifold having first and second nozzle means;

positioning said manifold within said furnace at a position that is physically spaced from said seed;

providing Ga liquid to said first nozzle means;

providing $NH_3$ gas to said second nozzle means;

heating said furnace to a temperature sufficient to produce vaporization of said Ga liquid and decomposition of said $NH_3$ gas; and as GaN crystals are grown on said seed, maintaining said GaN crystal growth at a constant distance from said manifold.

5. The method of claim 4 wherein said constant distance is from about 0.3 to about 1 mm.

6. The method of claim 5 including the step of:

rotating said seed as GaN crystals are grown.

7. The method of claim 4 the step of:

providing a pressurized flow of $N_2$ to said first nozzle means.

8. The method of claim 7 wherein said furnace is heated to a temperature of about 1200-degrees C.

9. A method of growing GaN crystals on the external surface of a GaN seed, comprising the steps of:

providing a reactor furnace;

providing a GaN seed;

positioning said seed within said furnace;

providing a gas-flow manifold having first and second nozzle means;

positioning said manifold within said furnace at a position that is physically spaced from said seed;

providing Ga to said first nozzle means;

providing $NH_3$ to said second nozzle means;

heating said furnace to a temperature in the range of from about 750 to about 1200-degrees C. at said manifold to produce vaporization of said Ga and decomposition of said $NH_3$;

spacing said seed from said manifold by a distance of from about 0.3 to about 1 mm;

providing motive means to rotate said seed and to linearly move said seed away from said manifold as GaN crystal is grown;

as GaN crystal is grown, continuously maintaining said manifold spaced from said GaN crystal growth by a distance from about 0.3 to about 1 mm; and as GaN crystal is grown, continuously rotating said seed at from about 1 to about 100 revolutions per minute.

10. The method of claim 9 including the step of:

providing $N_2$ gas to said first nozzle means.

11. A reactor furnace for epitaxially growing GaN crystals on the exterior surface of a crystalline GaN seed, comprising:

a generally closed housing having an interior-volume, a first inlet, a second inlet, and a generally centrally located axis;

a hollow cylindrical susceptor element mounted within said interior-volume so as to be generally centered on said axis, said susceptor element defining a processing-volume within said susceptor element;

an induction heater surrounding said housing and operable to heat said processing-volume to a temperature in the range of from about 750 to about 1200-degrees C.;

a movable metal shaft mounted generally coincident with said axis and having a first end extending within said processing-volume;

motor means connected to a second end of said shaft for rotating said shaft about said axis and for linearly moving said shaft along said axis;

a GaN seed mounted on said first end of said shaft;

a gas-flow manifold mounted within said processing volume and generally centered on said axis, said manifold having a manifold surface closely spaced from said seed;

first and second nozzle means on said manifold surface;

first conduit means connecting said first housing inlet to said first nozzle means for supplying Ga vapor to said first nozzle means; and second conduit means connecting said second housing inlet to said second nozzle means for supplying anhydrous $NH_3$ gas to said second nozzle means;

said motor means operating to rotate said GaN seed and to linearly move said GaN seed away from said manifold as GaN crystals are epitaxially grown on said GaN seed, so as to maintain a substantially constant spacing between said manifold surface and GaN crystals epitaxially grown on said seed.

12. The reactor furnace of claims 11 including:

a hollow cylindrical heat-insulator element mounted within said interior-volume and generally centered on said axis and surrounding said susceptor element.

13. The reactor furnace of claim 12 including:

cooling means surrounding an exterior surface of said housing.

14. The reactor furnace of claim 13 wherein said motor means operates to rotate said shaft at a speed of from about 1 to about 100 revolutions per minute, and wherein said motor means operates to move said shaft linearly away from said manifold-surface so as to maintain a substantially constant spacing of about 1 mm between said manifold-surface and GaN crystals that are epitaxially grown on said seed.

15. The reactor furnace of claim 14 wherein $N_2$ gas is additionally supplied to said first inlet.

16. A method of epitaxially growing GaN on the external surface of a GaN seed, comprising the steps of:

providing a GaN seed;

positioning said GaN seed within a growth furnace;

heating said growth furnace to a temperature of about 1200-degrees C.;

providing a gas-flow manifold within said growth furnace at a location that is physically spaced from said GaN seed, said manifold having first nozzle means and second nozzle means;

providing a flow of Ga vapor to said first nozzle means;

providing a flow of $NH_3$ gas to said second nozzle means;

providing a pressurized flow of $N_2$ to said first nozzle means;

spacing said seed from said manifold by a distance of from about 0.3 to about 1 mm;

providing motive means to rotate said GaN seed and to linearly move said GaN seed away from said manifold as GaN layers are epitaxially grown;

as GaN layers are epitaxilly grown, continuously maintaining said manifold spaced from said epitaxial grown GaN layers by a distance from about 0.3 to about 1 mm; and as GaN layers are epitaxially grown, continuously rotating said GaN seed at from about 1 to about 100 revolutions per minute.

* * * * *